United States Patent
Livshitz

(10) Patent No.: US 7,752,521 B2
(45) Date of Patent: Jul. 6, 2010

(54) LOW DENSITY PARITY CHECK (LDPC) CODE

(75) Inventor: Michael Livshitz, Rockville, MD (US)

(73) Assignee: Nortel Networks Limited, Montreal, Quebec (CA)

(*) Notice: Subject to any disclaimer, the term of this patent is extended or adjusted under 35 U.S.C. 154(b) by 970 days.

(21) Appl. No.: 11/393,622

(22) Filed: Mar. 30, 2006

(65) Prior Publication Data

US 2006/0242534 A1 Oct. 26, 2006

Related U.S. Application Data

(63) Continuation-in-part of application No. PCT/CA2005/001563, filed on Oct. 12, 2005.

(60) Provisional application No. 60/635,525, filed on Dec. 13, 2004, provisional application No. 60/617,902, filed on Oct. 12, 2004, provisional application No. 60/627,348, filed on Nov. 12, 2004, provisional application No. 60/638,832, filed on Dec. 22, 2004, provisional application No. 60/639,420, filed on Dec. 22, 2004, provisional application No. 60/647,259, filed on Jan. 26, 2005, provisional application No. 60/656,587, filed on Feb. 25, 2005, provisional application No. 60/673,323, filed on Apr. 20, 2005, provisional application No. 60/727,932, filed on Oct. 18, 2005.

(51) Int. Cl.
*H03M 13/00* (2006.01)

(52) U.S. Cl. ........................ 714/752; 714/758

(58) Field of Classification Search .......... 714/752, 714/758

See application file for complete search history.

(56) References Cited

U.S. PATENT DOCUMENTS

| 7,203,897 | B2* | 4/2007 | Blankenship et al. ....... 714/804 |
| 7,263,651 | B2 | 8/2007 | Xia et al. |
| 2004/0034828 | A1 | 2/2004 | Hocevar |
| 2005/0050435 | A1* | 3/2005 | Kyung et al. ................ 714/800 |
| 2005/0289437 | A1 | 12/2005 | Oh et al. |
| 2006/0015791 | A1* | 1/2006 | Kikuchi et al. .............. 714/758 |

OTHER PUBLICATIONS

Eric Jacobsen, "LDPC FEC for 802.11n application", IEEE 802.11-03/0865r1, Intel Labs.
Zhang et al.,"VLSI Implementation-Oriented (3, k)-Regular Low-Density Parity-Check Codes", IEEE, pp. 25-36, Sep. 2001.
Niu, et al., "LDPC versus Convolutional Codes in MIMO-OFDM over 11n channels", IEEE 802.11-04/682r0, Jul. 2004, pp. 1-15.
Du, et al., "LDPC for MIMO Systems", IEEE 802.11-04/0714r0, Jul. 2004, pp. 1-12.
Purkovic, et al., "Structured LDPC Codes as an Advanced Coding Scheme for 802.11n", IEEE 802.11-04/885r0, Sep. 2004, pp. 1-10.
Moschini, et al., "St Microelectronics Partial Proposal for LDPCC as Optional Coding Technique for IEEE 802.11 TGn High Throughput Standard", IEEE 802.11-04/898R1, Aug. 2004, pp. 1-44.

(Continued)

*Primary Examiner*—Sam Rizk
(74) *Attorney, Agent, or Firm*—Pearne & Gordon LLP

(57) ABSTRACT

Low density parity check code (LDPC) base parity check matrices and the method for use thereof in communication systems. The method of expanding the base check parity matrix is described. Examples of expanded LDPC codes with different code lengths and expansion factors are also shown.

27 Claims, 3 Drawing Sheets

OTHER PUBLICATIONS

Moschini, et al., "St Microelectronics LDPCC Proposal for 802.11N CFP", IEEE 802.11-04/0900R0, Aug. 2004, pp. 1-20.

Stolpman, et al., "Irregular Structured LDPC Codes With Rate Compatibility for TGN", IEEE 802.11-00/XXX, Jan. 2000, pp. 1-18.

Stolpman, et al., "Structured LDPC Code Design", IEEE 802.11-04/1362R0, Nov. 2004, pp. 1-11.

Lindskog, et al., "Record and Playback PHY Abstraction for 802.11N MAC Simulations- Using Soft Per Estimates", IEEE 802.11-04/0182 00R1, Feb. 16, 2004, pp. 1-12.

Sampath, et al., "Record and Playback PHY Abstraction for 802.11N MAC Simulations", IEEE 802.11-04/0183 00R3, Mar. 15, 2004, pp. 1-24.

Stephens, et al., "IEEE 802.11 TGN Comparison Criteria (Phy-related 4.6 sections working document)", Intel Corp., IEEE 802.11-02/814r5, Dec. 2003, pp. 1-22.

Coffey, et al., "Joint Proposal High Throughput Extension to the 802.11 Standard: PHY", IEEE 802.11-/051102 R4, Jan. 2006, pp. 1-80.

Edmonston, et al., "Turbo Codes for IEEE 802.11n", Icoding Technology, Inc., IEEE 802.11/04 0003-00-000n, Jan. 2004, pp. 1-20.

Simoens, et al., "Towards IEEE802.11 HDR in the Enterprise", Motorola, IEEE 802.11-02/312r0, May 2002, pp. 1-10.

Gorokhov, et al., "MIMO-OFDM for high throughput WLAN experimental results", Phillips Research, IEEE 802.11-02-708 R1, IEEE 802.11 session Hawaii Nov. 2002, pp. 1-23.

Mahadevappa, et al., "Different Channel Coding Options for MIMO-ODFM 802.11n", Realtek Semiconductors, Irvine, CA, IEEE 802.11-04/0014r0, Jan. 2004, pp. 1-22.

Jacobsen, et al., "LDPC FEC for IEEE 802.11n Applications", Intel Labs Communications Technology Laboratory, IEEE 802.11-03/0865r0, Nov. 10, 2003, pp. 1-35.

Purkovic, et al., "LDPC vs. Convolutional Codes for 802.11n Applications: Performance Comparison", Nortel Networks, IEEE 802.11-04/0071r1, Jan. 2004, pp. 1-12.

Tzannes, et al., "Extended Data Rate 802.11a", Aware, Inc., IEEE 802.11-01/232r0, Mar. 2002, pp. 1-9.

Ouyang, et al., "On the Use of Reed Solomon Codes for 802.11n", Philips Research, IEEE 802.11-04/96r0, Jan. 2004, pp. 1-9.

Liang, et al., "Simplifying MAC FEC Implementation and Related Issues", Texas Instruments Incorporated, IEEE 802.11-02/0207r0, Mar. 2002, pp.1-15.

Coffey, et al., "MAC FEC Performance", Texas Instruments, IEEE 802.11-02/239r0, Mar. 2002, pp. 1-18.

IEEE Standards Interpretations for IEEE Std 802.11a™-1999, Copyright © 2008 by the Institute of Electrical and Electronics Engineers, Inc., Three Park Avenue, New York, New York 10016-5997 USA; pp. 1-6.

Schumacher, et al., "TGn Channel Models", Zyray Wireless, IEEE 802.11-03/940r4, May 2004, pp. 1-46.

Purkovic, et al., "LDPC Vs. Convolutional Codes: Performance and Complexity Comparison", Nortel Networks, IEEE 802.11-04/XXXXR0, Mar. 2004, pp. 1-10.

Schumacher, et al., "Description of a MATLAB® implementation of the Indoor MIMO WLAN channel model proposed by the IEEE 802.11 TGn Channel Model Special Committee", FUNDP —The University of Namur, Jan. 2004, pp. 1-27.

R. Echard, et al., "The P-Rotation Low-Density Parity Check Codes", in Proc. Globecom 2001, Nov. 2001, pp. 980-984.

M.M. Mansour, et al., High-Throughput LDPC Decoders, IEEE Trans. on VLSI Systems, vol. 11, No. 6, Dec. 2003, pp. 976-996.

Classon, et al., "LDPC Coding for OFDMA PHY", Nov. 2004, pp. 1-7.

Syed Aon Mujtaba, "TGn Sync Proposal Technical Specification", Nov. 2004, p. 143, Section 11.2.4.4.

Singh, et al., "WWiSE Proposal: High throughput extension to the 802.11 Standard", Aug. 2004, pp. 45-48, Section 20.3.5.7.3.

Yazdani, et al., "On Construction of Rate Compatible Low-Density Parity-Check Codes", IEEE Communication Letters, vol. 8, No. 3, Mar. 2004 (Abstract enclosed).

Ha, et al., "Puncturing for Finite Length Low-Density Parity Check Codes", ISIT 2004 (Abstract enclosed).

Tian, et al., "Rate Compatible Low-Density Parity-Check Codes", ISIT 2004, Chicago, p. 153.

Ha, et al., "Rate Compatible Puncturing of Length Low-Density Parity-Check Codes", IEEE Transactions on Information Theory, vol. 50, No. 11, Nov. 2004 (Abstract enclosed).

Zhong, et al., "Design of VLSI Implementation-Oriented LDPC Codes", IEEE Semiannual Vehicular Technology Conference (VTC) Oct. 2003, pp. 1-4.

Richardson, et al., "Design of Capacity-Approaching Irregular Low-Density Parity-Check Codes", IEEE Transactions on Information Theory, Feb. 2001, vol. 47, No. 2, pp. 619-637.

Chung, et al., "Analysis of Sum-Product Decoding of Low-Density Parity-Check Codes Using a Gaussian Approximation", IEEE Transactions on information Theory, vol. 47, Feb. 2001, pp. 657-670.

Purkovic, et al "Algebraic Low-Density Parity-Check Codes for OFDMA PHY Layer", Nortel Networks, May 2004, pp. 1-8.

Hocevar, "LDPC Code Construction With Flexible Hardware Implementation", IEEE International Conference on Communications, 2003, vol. 4, pp. 2708-2712.

Hillman, "Minutes of High Throughput Task Group Meetings", Jan. 2004, pp. 1-9.

* cited by examiner

| 1 | 0 | 1 | 0 | 1 | 0 | 0 | 0 |
|---|---|---|---|---|---|---|---|
| 1 | 0 | 0 | 1 | 1 | 1 | 0 | 0 |
| 0 | 1 | 1 | 0 | 0 | 1 | 1 | 0 |
| 1 | 0 | 0 | 1 | 0 | 0 | 1 | 1 |

Base matrix ← 41

Expanded matrix (42), with callout 43

FIG. 5

| 1 | 0 | 1 | 0 | 1 | 1 | 0 | 0 |
|---|---|---|---|---|---|---|---|
| 1 | 0 | 0 | 1 | 1 | 1 | 1 | 0 |
| 0 | 1 | 1 | 0 | 0 | 0 | 1 | 1 |
| 1 | 0 | 0 | 1 | 1 | 0 | 0 | 1 |

Base matrix — 51

Expanded matrix (52)

FIG. 6

LOW DENSITY PARITY CHECK (LDPC) CODE

This application is a continuation-in-part of International Application PCT/CA2005/001563, with an international filing date of Oct. 12, 2005, which claims the benefits of U.S. Provisional Applications No. 60/635,525, filed Dec. 13, 2004; 60/617,902, filed Oct. 12, 2004; 60/627,348, filed Nov. 12, 2004; 60/635,525, filed Dec. 13, 2004; 60/638,832, filed Dec. 22, 2004; 60/639,420, filed Dec. 22, 2004; 60/647,259, filed Jan. 26, 2005; 60/656,587, filed Feb. 25, 2005; and 60/673,323, filed Apr. 20, 2005.

This application also claims the benefit of U.S. Provisional Patent Application Ser. No. 60/727,932 filed on Oct. 18, 2005.

FIELD OF THE INVENTION

The present invention generally pertains to forward error correction. In particular, the present invention relates to Low Density Parity Check (LDPC) codes.

BACKGROUND OF THE INVENTION

In a typical communication system, forward error correction (FEC) is often applied in order to improve robustness of the system against a wide range of impairments of the communication channel.

Referring to FIG. 1, in which a typical communication network channel is depicted having an information source 101, sending data to a source coder 102 that in turn forwards the data to a channel encoder 103. The encoded data is then sent to modulator 104 onto a carrier before being transmitted over a channel 105. After transmission, a like series of operations takes place at the receiver using a demodulator 106, channel decoder 107 and source decoder 108 to produce data suitable for the information sink 109. FEC is applied by encoding the information data stream at the transmit side at the encoder 103, and performing the inverse decoding operation on the receive side at the decoder 107. Encoding usually involves generation of redundant (parity) bits that allow more reliable reconstruction of the information bits at the receiver.

In many modern communication systems, FEC uses Low Density Parity Check (LDPC) codes that are applied to a block of information data of the finite length.

One way to represent LDPC codes is by using so-called Tanner graphs, in which N symbol nodes, correspond to bits of the codeword and M check nodes, correspond to the set of parity check constraints which define the code. Edges in the graph connect symbol nodes to check nodes.

LDPC codes can also be specified by a parity check matrix H of size M×N. In the matrix H, each column corresponds to one of the symbol nodes while each row corresponds to one of the check nodes. This matrix defines an LDPC block code (N, K), where K is the information block size, N is the length of the codeword, and M is the number of parity check bits. M=N−K. A general characteristic of the LDPC parity check matrix is the low density of non-zero elements that allows utilization of efficient decoding algorithms. The structure of the LDPC code parity check matrix is first outlined in the context of prior art hardware architectures that can exploit the properties of these parity check matrices.

In order to accommodate various larger code rates without redesigning parity check matrix and therefore avoiding changing significantly base hardware wiring, expansion of a base parity check matrix is one of the common approaches. This may be achieved, for example, by replacing each non-zero element by a permutation matrix of the size of the expansion factor.

One problem often faced by the designer of LDPC codes is that the parity part of the base parity check matrix does not allow simple encoding algorithm. Another problem is that row weight is not uniform or not close to uniform.

Therefore, there is an unmet need for LDPC codes for use in modern communication systems.

SUMMARY OF THE INVENTION

In accordance with a first aspect of the present invention there is provided a method for constructing a low-density parity-check (LDPC) code having a structured parity check matrix, the method comprises the steps of: a) constructing a base parity check matrix $H=[H_d|H_p]$, $H_d$ is a data portion of the base parity check matrix, and $H_p$ is the parity portion of the base parity check matrix; and b) expanding the base parity check matrix into an expanded parity check matrix by replacing each non-zero element by a shifted identity matrix; and replacing each zero element of the plurality of elements by a zero matrix. The base parity check matrix has a coding rate of $R=½, ⅔, ¾, ⅚,$ or $⅞$; and accordingly is of the size of 12×24, 8×24, 6×24, 4×24, or 3×24.

Preferably, the parity portion allows a recursive encoding algorithm.

Preferably, the inverse of the parity portion of the expanded parity check matrix is sparse, allowing simple encoding per equation $$p = H_{p\_exp}^{-1} H_{d\_exp} d$$

wherein d is a vector of uncoded bits, p is a vector of parity bits, $H_{p\_exp}^{-1}$ is the inverse of the parity portion $H_p$ of the expanded parity check matrix, and $H_{d\_exp}$ is the data portion $H_d$ the expanded parity check matrix.

More preferably, the data portion of the base parity check matrix has a minimum column weight of 3; a coding rate of $R=⅔$, and has the size 8×24 and the total weight of the base parity check matrix is equal or less then 88.

More preferably, the base parity-check matrix is:

```
1 1 1 1 1 0 0 0 0 0 0 1 0 1 1 1 1 1 0 0 0 0 0 0
1 1 1 1 0 0 0 1 1 1 1 0 1 0 0 0 0 1 1 0 0 0 0 0
1 1 1 1 1 1 1 0 0 0 1 0 0 0 1 0 0 0 1 1 0 0 0 0
1 1 1 1 1 0 0 0 0 1 1 0 1 1 0 0 0 0 0 1 1 0 0 0
1 1 1 1 0 1 1 0 1 0 0 1 0 0 0 0 1 0 0 0 1 1 0 0
1 1 1 1 1 0 1 0 0 0 0 0 1 1 1 0 0 0 0 0 0 1 1 0
1 1 1 1 1 1 0 1 0 0 0 1 0 0 0 1 0 0 0 0 0 0 1 1
1 1 1 1 1 0 0 1 1 1 0 0 0 0 0 1 1 0 0 0 0 0 0 1
```

More preferably, the base parity check matrix is expanded by an expansion factor L of 27, and supports a code length of up to 648, and is represented by the expanded parity check matrix:

$$\begin{pmatrix}
3 & 11 & 13 & 25 & 4 & -1 & -1 & -1 & -1 & -1 & -1 & 22 & -1 & 11 & 15 & 22 & 1 & 0 & -1 & -1 & -1 & -1 & -1 & -1 \\
10 & 2 & 19 & 12 & -1 & -1 & -1 & 15 & 5 & 9 & 24 & -1 & 15 & -1 & -1 & -1 & -1 & 0 & 0 & -1 & -1 & -1 & -1 & -1 \\
4 & 26 & 24 & 11 & 2 & 19 & 17 & -1 & -1 & -1 & 3 & -1 & -1 & -1 & 4 & -1 & -1 & -1 & 0 & 0 & -1 & -1 & -1 & -1 \\
24 & 21 & 15 & 5 & 8 & -1 & -1 & -1 & -1 & 19 & 15 & -1 & 17 & 3 & -1 & -1 & -1 & -1 & -1 & 0 & 0 & -1 & -1 & -1 \\
15 & 18 & 7 & 25 & -1 & 7 & 6 & -1 & 8 & -1 & -1 & 4 & -1 & -1 & -1 & -1 & 0 & -1 & -1 & -1 & 0 & 0 & -1 & -1 \\
1 & 24 & 23 & 12 & 23 & -1 & 1 & -1 & -1 & -1 & -1 & -1 & 0 & 0 & 12 & -1 & -1 & -1 & -1 & -1 & -1 & 0 & 0 & -1 \\
13 & 4 & 12 & 17 & 22 & 23 & -1 & 4 & -1 & -1 & -1 & 6 & -1 & -1 & -1 & 9 & -1 & -1 & -1 & -1 & -1 & -1 & 0 & 0 \\
14 & 25 & 26 & 3 & 5 & -1 & -1 & 8 & 2 & 7 & -1 & -1 & -1 & -1 & -1 & 7 & 1 & -1 & -1 & -1 & -1 & -1 & -1 & 0
\end{pmatrix}$$

wherein −1 represents L×L all-zero square matrix, and other integers represent L×L identity matrix, circularly right shifted a number of times corresponding to the integers.

Preferably, the base parity check matrix has a coding rate of R=¾, and is:

$$\begin{pmatrix}
1 & 1 & 1 & 1 & 0 & 0 & 0 & 1 & 1 & 0 & 1 & 0 & 1 & 1 & 1 & 1 & 0 & 1 & 1 & 1 & 0 & 0 & 0 & 0 \\
1 & 1 & 1 & 1 & 0 & 1 & 1 & 0 & 1 & 0 & 0 & 1 & 0 & 1 & 1 & 1 & 1 & 0 & 0 & 1 & 1 & 0 & 0 & 0 \\
1 & 0 & 1 & 0 & 1 & 1 & 1 & 1 & 0 & 1 & 0 & 0 & 1 & 0 & 1 & 1 & 1 & 1 & 0 & 0 & 1 & 1 & 0 & 0 \\
1 & 1 & 0 & 1 & 1 & 1 & 1 & 1 & 0 & 1 & 1 & 1 & 0 & 0 & 0 & 0 & 1 & 1 & 1 & 0 & 0 & 1 & 1 & 0 \\
0 & 0 & 0 & 0 & 1 & 1 & 1 & 1 & 1 & 1 & 1 & 1 & 1 & 1 & 1 & 0 & 0 & 0 & 0 & 0 & 0 & 0 & 1 & 1 \\
0 & 1 & 1 & 1 & 1 & 0 & 0 & 0 & 1 & 1 & 1 & 1 & 1 & 1 & 0 & 0 & 1 & 1 & 1 & 0 & 0 & 0 & 0 & 1
\end{pmatrix}.$$

More preferably, the base parity check matrix is expanded by expansion factors L between 24 and $L_{max}$=96, and is represented by the expanded parity check matrix:

$$\begin{pmatrix}
6 & 38 & 3 & 93 & -1 & -1 & -1 & 30 & 70 & -1 & 86 & -1 & 37 & 38 & 4 & 11 & -1 & 46 & 48 & 0 & -1 & -1 & -1 & -1 \\
62 & 94 & 19 & 84 & -1 & 92 & 78 & -1 & 15 & -1 & -1 & 92 & -1 & 45 & 24 & 32 & 30 & -1 & -1 & 0 & 0 & -1 & -1 & -1 \\
71 & -1 & 55 & -1 & 12 & 66 & 45 & 79 & -1 & 78 & -1 & -1 & 10 & -1 & 22 & 55 & 70 & 82 & -1 & -1 & 0 & 0 & -1 & -1 \\
38 & 61 & -1 & 66 & 9 & 73 & 47 & 64 & -1 & 39 & 61 & 43 & -1 & -1 & -1 & -1 & 95 & 32 & 0 & -1 & -1 & 0 & 0 & -1 \\
-1 & -1 & -1 & -1 & 32 & 52 & 55 & 80 & 95 & 22 & 6 & 51 & 24 & 90 & 44 & 20 & -1 & -1 & -1 & -1 & -1 & -1 & 0 & 0 \\
-1 & 63 & 31 & 88 & 20 & -1 & -1 & -1 & 6 & 40 & 56 & 16 & 71 & 53 & -1 & -1 & 27 & 26 & 48 & -1 & -1 & -1 & -1 & 0
\end{pmatrix}$$

wherein −1 represents L×L all-zero square matrix, the integer $s_{ij}$ represents circular shifted L×L identity matrix, the amount of the shift $s_{ij}'$ is determined as follows:

$$s_{ij}' = \begin{cases} \text{floor}\left(\frac{L \times s_{ij}}{L_{max}}\right), & s_{ij} > 0 \\ s_{ij}, & \text{otherwise} \end{cases}.$$

In accordance with another aspect of the present invention there is provide a storage medium readable by a computer encoding a computer program for execution by the computer to carry out a method for constructing a low-density parity-check (LDPC) code having a structured parity check matrix, the computer program comprises: a) code means for constructing a base parity check matrix $H=[H_d|H_p]$ having a plurality of elements, $H_d$ being a data portion of the base parity check matrix, $H_p$ being the parity portion of the base parity check matrix; and b) code means for expanding the base parity check matrix into an expanded parity check matrix by replacing each non-zero element of the plurality of elements by a shifted identity matrix, and each zero element of the plurality of elements by a zero matrix. The base parity check matrix has a coding rate selected from the group consisting of R=½, ⅔, ¾, ⅚, and ⅞; and accordingly is of the size selected from the group consisting of 12×24, 8×24, 6×24, 4×24, and 3×24.

Preferably, the data portion of the base parity check matrix has a minimum weight of 3, the base parity check matrix has a constraint of maximum base parity check matrix weight of 88, and the base parity check matrix is:

$$\begin{matrix}
1 & 1 & 1 & 1 & 1 & 0 & 0 & 0 & 0 & 0 & 0 & 1 & 0 & 1 & 1 & 1 & 1 & 1 & 0 & 0 & 0 & 0 & 0 & 0 \\
1 & 1 & 1 & 1 & 0 & 0 & 0 & 1 & 1 & 1 & 1 & 0 & 1 & 0 & 0 & 0 & 0 & 1 & 1 & 0 & 0 & 0 & 0 & 0 \\
1 & 1 & 1 & 1 & 1 & 1 & 1 & 0 & 0 & 0 & 1 & 0 & 0 & 0 & 1 & 0 & 0 & 0 & 1 & 1 & 0 & 0 & 0 & 0 \\
1 & 1 & 1 & 1 & 1 & 0 & 0 & 0 & 0 & 1 & 1 & 0 & 1 & 1 & 0 & 0 & 0 & 0 & 0 & 1 & 1 & 0 & 0 & 0 \\
1 & 1 & 1 & 1 & 0 & 1 & 1 & 0 & 1 & 0 & 0 & 1 & 0 & 0 & 0 & 0 & 1 & 0 & 0 & 0 & 1 & 1 & 0 & 0 \\
1 & 1 & 1 & 1 & 1 & 0 & 1 & 0 & 0 & 0 & 0 & 0 & 1 & 1 & 1 & 0 & 0 & 0 & 0 & 0 & 0 & 1 & 1 & 0 \\
1 & 1 & 1 & 1 & 1 & 1 & 0 & 1 & 0 & 0 & 0 & 1 & 0 & 0 & 0 & 1 & 0 & 0 & 0 & 0 & 0 & 0 & 1 & 1 \\
1 & 1 & 1 & 1 & 1 & 0 & 0 & 1 & 1 & 1 & 0 & 0 & 0 & 0 & 0 & 1 & 1 & 0 & 0 & 0 & 0 & 0 & 0 & 1 \\
\end{matrix}$$

More preferably, the base parity check matrix is expanded by an expansion factor L of 27, thereby supporting a code length of up to 648, and is represented by the expanded parity check matrix:

$$\begin{matrix}
3 & 11 & 13 & 25 & 4 & -1 & -1 & -1 & -1 & -1 & -1 & 22 & -1 & 11 & 15 & 22 & 1 & 0 & -1 & -1 & -1 & -1 & -1 & -1 \\
10 & 2 & 19 & 12 & -1 & -1 & -1 & 15 & 5 & 9 & 24 & -1 & 15 & -1 & -1 & -1 & -1 & 0 & 0 & -1 & -1 & -1 & -1 & -1 \\
4 & 26 & 24 & 11 & 2 & 19 & 17 & -1 & -1 & -1 & 3 & -1 & -1 & -1 & 4 & -1 & -1 & -1 & 0 & 0 & -1 & -1 & -1 & -1 \\
24 & 21 & 15 & 5 & 8 & -1 & -1 & -1 & -1 & 19 & 15 & -1 & 17 & 3 & -1 & -1 & -1 & -1 & -1 & 0 & 0 & -1 & -1 & -1 \\
15 & 18 & 7 & 25 & -1 & 7 & 6 & -1 & 8 & -1 & -1 & 4 & -1 & -1 & -1 & -1 & 0 & -1 & -1 & -1 & 0 & 0 & -1 & -1 \\
1 & 24 & 23 & 12 & 23 & -1 & 1 & -1 & -1 & -1 & -1 & -1 & 0 & 0 & 12 & -1 & -1 & -1 & -1 & -1 & -1 & 0 & 0 & -1 \\
13 & 4 & 12 & 17 & 22 & 23 & -1 & 4 & -1 & -1 & -1 & 6 & -1 & -1 & -1 & 9 & -1 & -1 & -1 & -1 & -1 & -1 & 0 & 0 \\
14 & 25 & 26 & 3 & 5 & -1 & -1 & 8 & 2 & 7 & -1 & -1 & -1 & -1 & 7 & 1 & -1 & -1 & -1 & -1 & -1 & -1 & -1 & 0 \\
\end{matrix}$$

wherein −1 represents L×L all-zero square matrix, and other integers represent L×L identity matrix, circularly right shifted a number of times corresponding to the integers.

Preferably, the base parity check matrix has a coding rate of R=¾, and is:

$$\begin{matrix}
1 & 1 & 1 & 1 & 0 & 0 & 0 & 1 & 1 & 0 & 1 & 0 & 1 & 1 & 1 & 1 & 0 & 1 & 1 & 1 & 0 & 0 & 0 & 0 \\
1 & 1 & 1 & 1 & 0 & 1 & 1 & 0 & 1 & 0 & 0 & 1 & 0 & 1 & 1 & 1 & 1 & 0 & 0 & 1 & 1 & 0 & 0 & 0 \\
1 & 0 & 1 & 0 & 1 & 1 & 1 & 1 & 0 & 1 & 0 & 0 & 1 & 0 & 1 & 1 & 1 & 1 & 0 & 0 & 1 & 1 & 0 & 0 \\
1 & 1 & 0 & 1 & 1 & 1 & 1 & 1 & 0 & 1 & 1 & 1 & 0 & 0 & 0 & 0 & 1 & 1 & 1 & 0 & 0 & 1 & 1 & 0 \\
0 & 0 & 0 & 0 & 1 & 1 & 1 & 1 & 1 & 1 & 1 & 1 & 1 & 1 & 1 & 1 & 0 & 0 & 0 & 0 & 0 & 0 & 1 & 1 \\
0 & 1 & 1 & 1 & 1 & 0 & 0 & 0 & 1 & 1 & 1 & 1 & 1 & 1 & 0 & 0 & 1 & 1 & 1 & 0 & 0 & 0 & 0 & 1 \\
\end{matrix}$$

wherein −1 represents L×L all-zero square matrix, the integer $s_{ij}$ represents circular shifted L×L identity matrix, the amount of the shift $s_{ij}'$ is determined as follows:

More preferably, the base parity check matrix is expanded by expansion factors L between 24 and $L_{max}$=96, and is represented by the expanded parity check matrix:

$$\begin{matrix}
6 & 38 & 3 & 93 & -1 & -1 & -1 & 30 & 70 & -1 & 86 & -1 & 37 & 38 & 4 & 11 & -1 & 46 & 48 & 0 & -1 & -1 & -1 & -1 \\
62 & 94 & 19 & 84 & -1 & 92 & 78 & -1 & 15 & -1 & -1 & 92 & -1 & 45 & 24 & 32 & 30 & -1 & -1 & 0 & 0 & -1 & -1 & -1 \\
71 & -1 & 55 & -1 & 12 & 66 & 45 & 79 & -1 & 78 & -1 & -1 & 10 & -1 & 22 & 55 & 70 & 82 & -1 & -1 & 0 & 0 & -1 & -1 \\
38 & 61 & -1 & 66 & 9 & 73 & 47 & 64 & -1 & 39 & 61 & 43 & -1 & -1 & -1 & -1 & 95 & 32 & 0 & -1 & -1 & 0 & 0 & -1 \\
-1 & -1 & -1 & -1 & 32 & 52 & 55 & 80 & 95 & 22 & 6 & 51 & 24 & 90 & 44 & 20 & -1 & -1 & -1 & -1 & -1 & -1 & 0 & 0 \\
-1 & 63 & 31 & 88 & 20 & -1 & -1 & -1 & 6 & 40 & 56 & 16 & 71 & 53 & -1 & -1 & 27 & 26 & 48 & -1 & -1 & -1 & -1 & 0 \\
\end{matrix}$$

$$s'_{ij} = \begin{cases} \text{floor}\left(\dfrac{L \times s_{ij}}{L_{\max}}\right), & s_{ij} > 0 \\ s_{ij}, & \text{otherwise} \end{cases}.$$

In accordance with another aspect of the present invention there is provide a low density parity check (LDPC) base parity check matrix for use in communication systems, comprising a data part having a minimum weight of 3, the base parity check matrix having a coding rate of R=⅔, a constraint of maximum base parity check matrix weight of 88, the base parity check matrix being:

$$\begin{matrix}
1 & 1 & 1 & 1 & 1 & 0 & 0 & 0 & 0 & 0 & 0 & 1 & 0 & 1 & 1 & 1 & 1 & 1 & 0 & 0 & 0 & 0 & 0 & 0 \\
1 & 1 & 1 & 1 & 0 & 0 & 0 & 1 & 1 & 1 & 1 & 0 & 1 & 0 & 0 & 0 & 0 & 1 & 1 & 0 & 0 & 0 & 0 & 0 \\
1 & 1 & 1 & 1 & 1 & 1 & 1 & 0 & 0 & 0 & 1 & 0 & 0 & 0 & 1 & 0 & 0 & 0 & 1 & 1 & 0 & 0 & 0 & 0 \\
1 & 1 & 1 & 1 & 1 & 0 & 0 & 0 & 0 & 1 & 1 & 0 & 1 & 1 & 0 & 0 & 0 & 0 & 0 & 1 & 1 & 0 & 0 & 0 \\
1 & 1 & 1 & 1 & 0 & 1 & 1 & 0 & 1 & 0 & 0 & 1 & 0 & 0 & 0 & 0 & 1 & 0 & 0 & 0 & 1 & 1 & 0 & 0 \\
1 & 1 & 1 & 1 & 1 & 0 & 1 & 0 & 0 & 0 & 0 & 0 & 1 & 1 & 1 & 0 & 0 & 0 & 0 & 0 & 0 & 1 & 1 & 0 \\
1 & 1 & 1 & 1 & 1 & 1 & 0 & 1 & 0 & 0 & 0 & 1 & 0 & 0 & 0 & 1 & 0 & 0 & 0 & 0 & 0 & 0 & 1 & 1 \\
1 & 1 & 1 & 1 & 0 & 0 & 1 & 1 & 1 & 0 & 0 & 0 & 0 & 0 & 1 & 1 & 0 & 0 & 0 & 0 & 0 & 0 & 0 & 1
\end{matrix}.$$

Preferably, an LDPC code is expanded from the above base parity check matrix by an expansion factor L of 27, thereby supporting a code length of up to 648, and is represented by following matrix:

$$\begin{matrix}
3 & 11 & 13 & 25 & 4 & -1 & -1 & -1 & -1 & -1 & -1 & 22 & -1 & 11 & 15 & 22 & 1 & 0 & -1 & -1 & -1 & -1 & -1 & -1 \\
10 & 2 & 19 & 12 & -1 & -1 & -1 & 15 & 5 & 9 & 24 & -1 & 15 & -1 & -1 & -1 & -1 & 0 & 0 & -1 & -1 & -1 & -1 & -1 \\
4 & 26 & 24 & 11 & 2 & 19 & 17 & -1 & -1 & -1 & 3 & -1 & -1 & -1 & 4 & -1 & -1 & -1 & 0 & 0 & -1 & -1 & -1 & -1 \\
24 & 21 & 15 & 5 & 8 & -1 & -1 & -1 & -1 & 19 & 15 & -1 & 17 & 3 & -1 & -1 & -1 & -1 & -1 & 0 & 0 & -1 & -1 & -1 \\
15 & 18 & 7 & 25 & -1 & 7 & 6 & -1 & 8 & -1 & -1 & 4 & -1 & -1 & -1 & -1 & 0 & -1 & -1 & -1 & 0 & 0 & -1 & -1 \\
1 & 24 & 23 & 12 & 23 & -1 & 1 & -1 & -1 & -1 & -1 & -1 & 0 & 0 & 12 & -1 & -1 & -1 & -1 & -1 & -1 & 0 & 0 & -1 \\
13 & 4 & 12 & 17 & 22 & 23 & -1 & 4 & -1 & -1 & -1 & 6 & -1 & -1 & -1 & 9 & -1 & -1 & -1 & -1 & -1 & -1 & 0 & 0 \\
14 & 25 & 26 & 3 & 5 & -1 & -1 & 8 & 2 & 7 & -1 & -1 & -1 & -1 & -1 & 7 & 1 & -1 & -1 & -1 & -1 & -1 & -1 & 0
\end{matrix}$$

wherein −1 represents L×L all-zero square matrix, and other integers represent L×L identity matrix, circularly right shifted a number of times corresponding to the matrix.

BRIEF DESCRIPTION OF THE DRAWINGS

The invention and the illustrated embodiments may be better understood, and the numerous objects, advantages, and features of the present invention and illustrated embodiments will become apparent to those skilled in the art by reference to the accompanying drawings, and wherein:

FIG. 5 is an example of a base parity check matrix expansion; and

FIG. 6 is an example showing an expanded matrix.

DETAILED DESCRIPTION OF EMBODIMENTS OF THE INVENTION

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Decoder Architecture

Efficient decoder architectures are enabled by designing the parity check matrix, which in turn defines the LDPC code, around some structural assumptions: structured LDPC codes.

One example of this design is that the parity check matrix comprises sub-matrices in the form of binary permutation or pseudo-permutation matrices.

The term "permutation matrices" is intended to mean square matrices with the property that each row and each column has one element equal to 1 and other elements equal to 0. The term "pseudo-permutation matrices" is intended to include matrices that are not necessarily square matrices, and matrices may have row(s) and/or column(s) consisting of all zeros. It has been shown, that using this design, significant savings in wiring, memory, and power consumption are possible while still preserving the main portion of the coding gain. This design enables various serial, parallel, and semi parallel hardware architectures and therefore various trade-off mechanisms.

Encoder Architecture

LDPC parity check matrix design also results in the reduction in encoder complexity. Classical encoding of LDPC codes is more complex than encoding of other advanced codes used in FEC, such as turbo codes. In order to ease this complexity it has become common to design systematic LDPC codes with the parity part comprising a lower triangular matrix. This allows simple recursive decoding. One simple example of a lower triangular matrix is a dual diagonal matrix as shown in FIG. 2.

Figure 1:
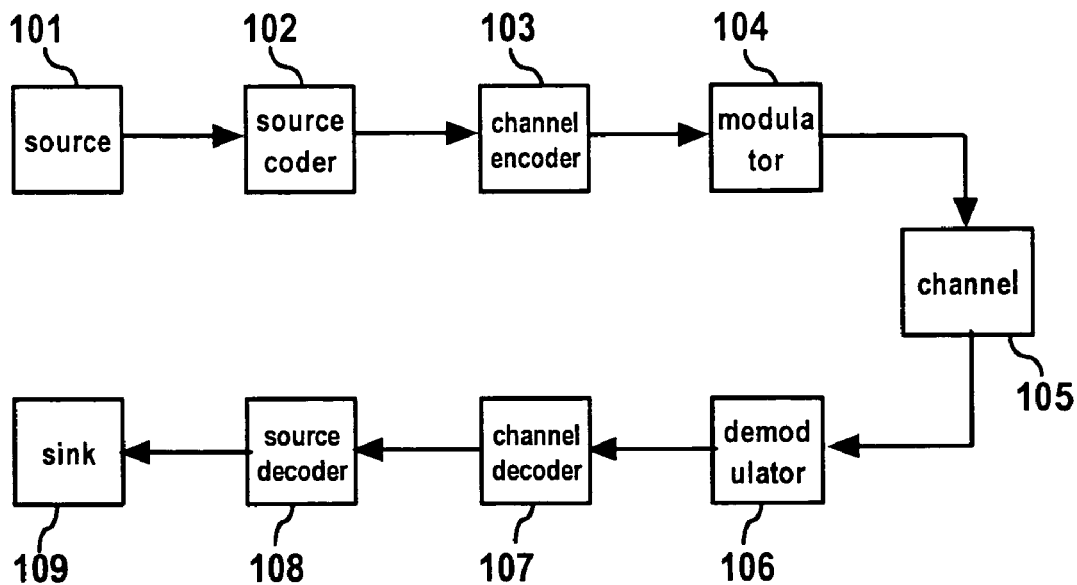
FIG. 1 shows a typical system in which embodiments of the invention may be practiced.
Figure 2:
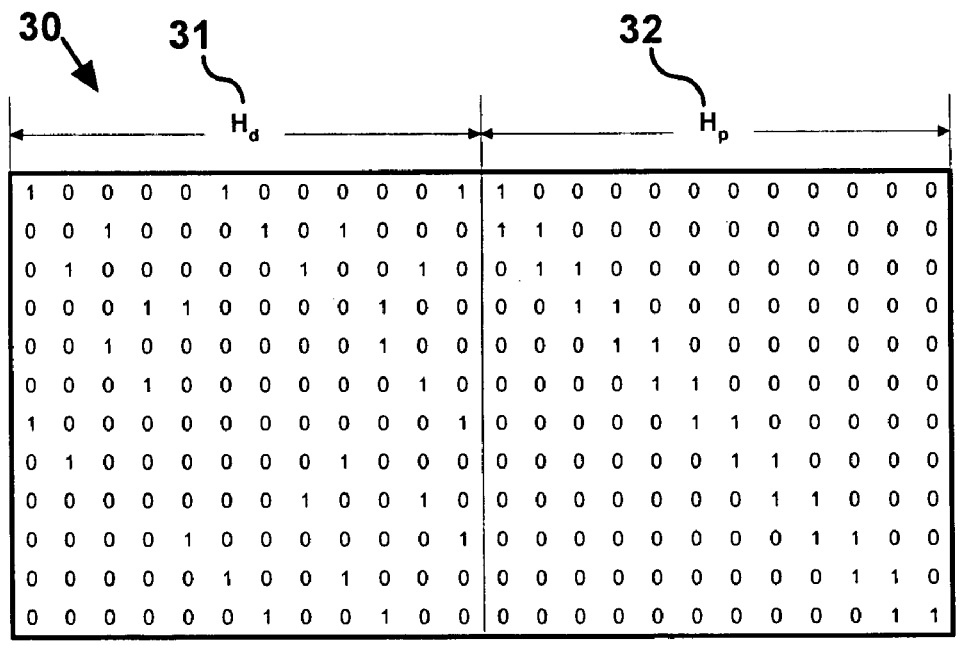
FIG. 2 depicts an example of a parity check matrix with dual diagonal.

Referring to FIG. 2, the parity check matrix 30 is partitioned as $H=[H_d|H_p]$. Data part $H_d$ 31 is an M×K matrix that corresponds to the data bits of the codeword. The design of the $H_d$ 31 matrix ensures high coding gain. Parity part $H_p$ 32 is in this example an M×M dual diagonal matrix and corresponds to the parity bits of the codeword. These codes are systematic block codes. The codeword vector for these systematic codes has the structure:

$$c = \begin{bmatrix} d \\ p \end{bmatrix}$$

where $d=[d_0 \ldots d_{K-1}]^T$ is the block of (uncoded) data bits and $p=[p_0 \ldots p_{M-1}]^T$ are the parity bits. A codeword is any binary (or in general, non-binary) N-vector c that satisfies:

$$Hc = H_d d + H_p p = 0$$

Thus, a given data block d is encoded by solving binary equation $H_d d = H_p p$ for the parity bits p. In principle, this involves inverting the M×M matrix $H_p$:

$$p = H_p^{-1} H_d d \quad \text{[equation 1]}$$

This assumes $H_p$ is invertible. If $H_p^{-1}$ is also low density then the direct encoding specified by the above formula can be done efficiently.

Expansion of the Base Parity Check Matrix

One desirable feature of LDPC codes is that they support various required code rates and block sizes. A common approach is to have a small base parity check matrix defined for each required code rate and to support various block sizes by expanding the base matrix. Since it is usually required to support a range of block sizes, a common approach is to define expansion for the largest block size and then apply other algorithms which specify expansion for smaller block sizes. Below is an example of a base matrix:

```
11   0  10   6   3   5   1   0  -1  -1  -1  -1
10   9   2   2   3   0  -1   0   0  -1  -1  -1
 7   9  11  10   4   7  -1  -1   0   0  -1  -1
 9   2   4   6   5   3   0  -1  -1   0   0  -1
 3  11   2   3   2  11  -1  -1  -1  -1   0   0
 2   7   1   0  10   7   1  -1  -1  -1  -1   0
```

In this example the base parity check matrix is designed for the code rate R=½ and its dimensions are $(M_b \times N_b)=(6 \times 12)$. Assume that the block (codeword) sizes (lengths) to be supported are in the range N=[72,144], with increments of 12, i.e. N=[72, 84, . . . , 132, 144]. In order to accommodate those block lengths the parity check matrix needs to be of the appropriate size (i.e. the number of columns match N, the block length). The number of rows is defined by the code rate: M=(1-R)N. The expansion is defined by the base parity check matrix elements and the expansion factor L, which results the maximum block size. The conventions used in this example, for interpreting the numbers in the base matrix, are as follows:

- −1, represents L×L all-zero square matrix, $0_L$, L equals 12 in this example;
- 0, represents L×L identity matrix, $I_L$.
- integer, r (<L), represents L×L identity matrix, $I_L$, rotated to the right (for example) a number of times corresponding to the integer.

The following example shows a rotated identity matrix where the integer specifying rotation is 5:

```
0 0 0 0 0 1 0 0 0 0 0 0
0 0 0 0 0 0 1 0 0 0 0 0
0 0 0 0 0 0 0 1 0 0 0 0
0 0 0 0 0 0 0 0 1 0 0 0
0 0 0 0 0 0 0 0 0 1 0 0
0 0 0 0 0 0 0 0 0 0 1 0
0 0 0 0 0 0 0 0 0 0 0 1
1 0 0 0 0 0 0 0 0 0 0 0
0 1 0 0 0 0 0 0 0 0 0 0
0 0 1 0 0 0 0 0 0 0 0 0
0 0 0 1 0 0 0 0 0 0 0 0
0 0 0 0 1 0 0 0 0 0 0 0
```

Therefore, for the codeword size of N=144, base parity check matrix needs to be expanded by an expansion factor of 12. That way the final parity check matrix to be used for encoding and generating the codeword of size 144, is of the size (72×144). In other words, the base parity check matrix was expanded $L_{max}$=12 times (from 6×12 to 72×144). For block sizes smaller than the maximum, the base parity check matrix gets expanded by a factor $L<L_{max}$. In this case expansion is performed in a similar fashion except that now matrices $I_L$ and $0_L$, are used instead of $I_{Lmax}$ and $0_{Lmax}$, respectively. Integers specifying the amount of rotation of the appropriate identity matrix, $I_L$, are derived from those corresponding to the maximum expansion.

Figure 3:
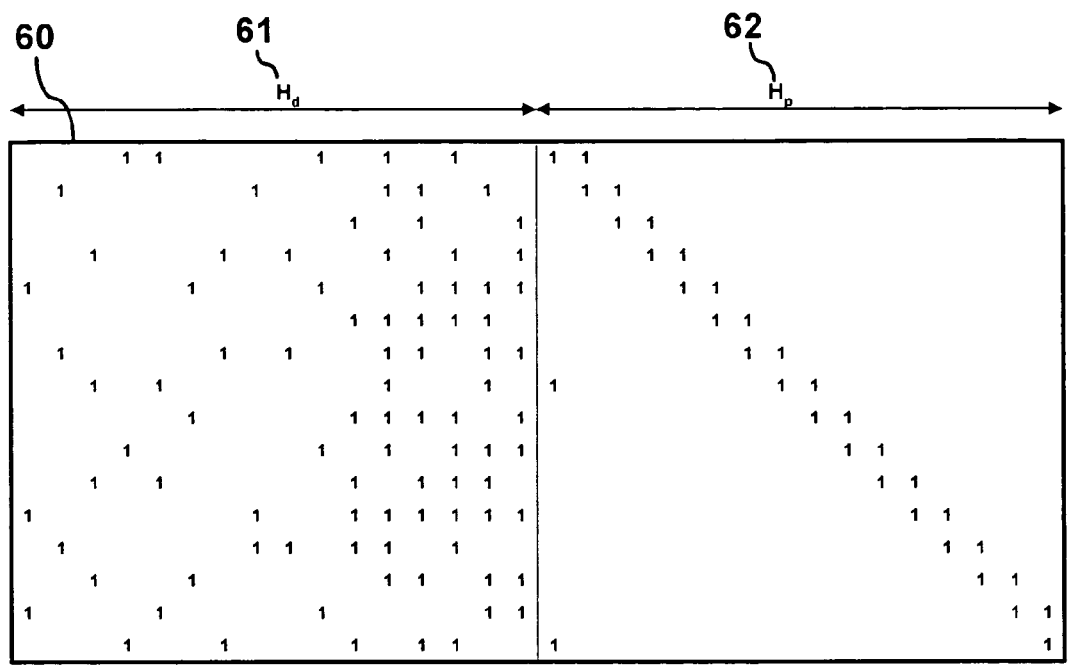
FIG. 3 illustrates an example of base parity check matrix.
Figure 4:
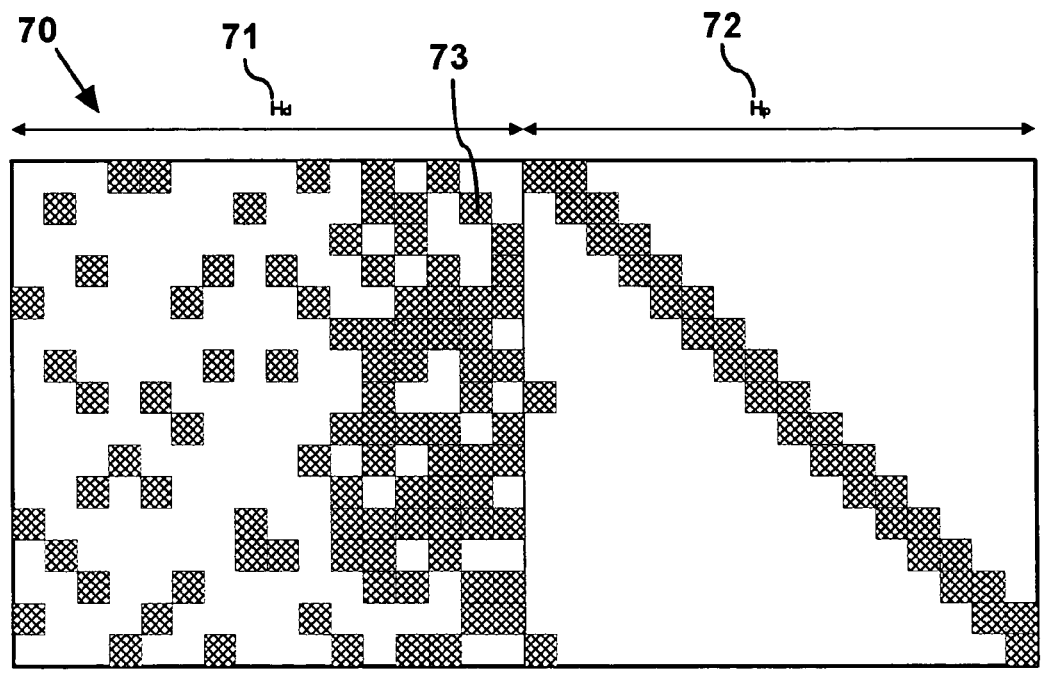
FIG. 4 shows an example of the expanded parity check matrix of FIG. 3.

An example of such a matrix is shown in FIG. 3 where the matrix 60 comprises the data part $H_d$ 61 and the parity part $H_p$ 62. The corresponding expanded matrix is shown in FIG. 4 also having a data part $H_d$ 71 and the parity part $H_p$ 72 of the matrix 70. Each of the shaded squares 73 indicates a L×L small permutation matrix that is placed on the position of the 1's in the base matrix, where L is the expansion factor. So if the size of the base parity check matrix was $M_b \times N_b$, the size of expanded matrix is now $M \times N = L M_b \times L N_b$.

The expansion may be done for example by replacing each non-zero element with a permutation matrix of the size of the expansion factor. One example of performing expansion is as follows:

Expansion of $H_p$ may be done by replacing each "0" element by an L×L zero matrix, $0_{L \times L}$, and each "1" element by an L×L identity matrix, $I_{L \times L}$, where L represents the expansion factor.

Expansion of $H_d$ may be done by replacing each "0" element by an L×L zero matrix, $0_{L \times L}$, and each "1" element by a circularly shifted version of an L×L identity matrix, $I_{L \times L}$. The shift order, s (number of circular shifts to the right, for example) is determined for each non-zero element of the base matrix.

It should be apparent to a person skilled in the art that these expansions can be implemented without the need to significantly change the base hardware wiring.

FIG. 5 shows an example of a base parity check matrix 41 and a corresponding expanded matrix 42 using 3×3 submatrices of which that labeled 43 is an example.

The simple recursive algorithm can be applied to the expanded matrix. If $h_{ij}$ represent elements of the $H_d$ portion of the expanded parity check matrix, then parity bits can be determined as follows:

$$p_0 = h_{0,0}d_0 + h_{0,1}d_1 + h_{0,2}d_2 + \ldots + h_{0,11}d_{11}$$

$$p_1 = h_{1,0}d_0 + h_{1,1}d_1 + h_{1,2}d_2 + \ldots + h_{1,11}d_{11}$$

$$p_2 = h_{2,0}d_0 + h_{2,1}d_1 + h_{2,2}d_2 + \ldots + h_{2,11}d_{11}$$

$$p_3 = p_0 + h_{3,0}d_0 + h_{3,1}d_1 + h_{3,2}d_2 + \ldots + h_{3,11}d_{11}$$

$$p_4 = p_1 + h_{4,0}d_0 + h_{4,1}d_1 + h_{4,2}d_2 + \ldots + h_{4,11}d_{11}$$

$$p_5 = p_2 + h_{5,0}d_0 + h_{5,1}d_1 + h_{5,2}d_2 + \ldots + h_{5,11}d_{11}$$

$$p_6 = p_3 + h_{6,0}d_0 + h_{6,1}d_1 + h_{6,2}d_2 + \ldots + h_{6,11}d_{11}$$

$$p_7 = p_4 + h_{7,0}d_0 + h_{7,1}d_1 + h_{7,2}d_2 + \ldots + h_{7,11}d_{11}$$

$$p_8 = p_5 + h_{8,0}d_0 + h_{8,1}d_1 + h_{8,2}d_2 + \ldots + h_{8,11}d_{11}$$

$$p_9 = p_6 + h_{9,0}d_0 + h_{9,1}d_1 + h_{9,2}d_2 + \ldots + h_{9,11}d_{11}$$

$$p_{10} = p_7 + h_{10,0}d_0 + h_{10,1}d_1 + h_{10,2}d_2 + \ldots + h_{10,11}d_{11}$$

$$p_{11} = p_8 + h_{11,0}d_0 + h_{11,1}d_1 + h_{11,2}d_2 + \ldots + h_{11,11}d_{11}$$

However, when the expansion factor becomes large, then the number of columns with only one non-zero element, i.e. 1 in the example here, in the $H_p$ becomes large as well. This may have a negative effect on the performance of the code. One remedy for this situation is to use a slightly modified dual diagonal $H_p$ matrix. This is illustrated with reference to FIG. 6 where the modified base parity check matrix 51 produces the expanded matrix 52.

The parity check equations now become:

$$h_{0,0}d_0 + h_{0,1}d_1 + \ldots + h_{0,11}d_{11} + p_0 + p_3 = 0 \quad \text{[equation 2]}$$

$$h_{1,0}d_0 + h_{1,1}d_1 + \ldots + h_{1,11}d_{11} + p_1 + p_4 = 0 \quad \text{[equation 3]}$$

$$h_{2,0}d_0 + h_{2,1}d_1 + \ldots + h_{2,11}d_{11} + p_2 + p_5 = 0 \quad \text{[equation 4]}$$

$$h_{3,0}d_0 + h_{3,1}d_1 + \ldots + h_{3,11}d_{11} + p_0 + p_3 + p_6 = 0 \quad \text{[equation 5]}$$

$$h_{4,0}d_0 + h_{4,1}d_1 + \ldots + h_{4,11}d_{11} + p_1 + p_4 + p_7 = 0 \quad \text{[equation 6]}$$

$$h_{5,0}d_0 + h_{5,1}d_1 + \ldots + h_{5,11}d_{11} + p_2 + p_5 + p_8 = 0 \quad \text{[equation 7]}$$

$$h_{6,0}d_0 + h_{6,1}d_1 + \ldots + h_{6,11}d_{11} + p_6 + p_9 = 0 \quad \text{[equation 8]}$$

$$h_{7,0}d_0 + h_{7,1}d_1 + \ldots + h_{7,11}d_{11} + p_7 + p_{10} = 0 \quad \text{[equation 9]}$$

$$h_{8,0}d_0 + h_{8,1}d_1 + \ldots + h_{8,11}d_{11} + p_8 + p_{11} = 0 \quad \text{[equation 10]}$$

$$h_{9,0}d_0 + h_{9,1}d_1 + \ldots + h_{9,11}d_{11} + p_0 + p_9 = 0 \quad \text{[equation 11]}$$

$$h_{10,0}d_0 + h_{10,1}d_1 + \ldots + h_{10,11}d_{11} + p_1 + p_{10} = 0 \quad \text{[equation 12]}$$

$$h_{11,0}d_0 + h_{11,1}d_1 + \ldots + h_{11,11}d_{11} + p_2 + p_{11} = 0 \quad \text{[equation 13]}$$

Now by summing up equations 2, 5, 8, and 11, the following expression is obtained:

$$(h_{0,0}+h_{3,0}+h_{6,0}+h_{9,0})d_0 + (h_{0,1}+h_{3,1}+h_{6,1}+h_{9,1})d_1 + \ldots + (h_{0,11}+h_{3,11}+h_{6,11}+h_{9,11})d_{11} + p_0+p_3+p_0+p_3+p_6+p_6+p_9+p_0+p_9 = 0$$

Since only $p_0$ appears an odd number of times in the equation above, all other parity check bits cancel except for $p_0$, and thus:

$$p_0 = (h_{0,0}+h_{3,0}+h_{6,0}+h_{9,0})d_0 + (h_{0,1}+h_{3,1}+h_{6,1}+h_{9,1})d_1 + \ldots + (h_{0,11}+h_{3,11}+h_{6,11}+9,11})d_{11}$$

Likewise:

$$p_1 = (h_{1,0}+h_{4,0}+h_{7,0}+h_{10,0})d_0 + (h_{1,1}+h_{4,1}+h_{7,1}+h_{10,1})d_1 + \ldots + (h_{1,11}+h_{4,11}+h_{7,11}+10,11})d_{11}$$

$$p_2 = (h_{2,0}+h_{5,0}+h_{8,0}+h_{11,0})d_0 + (h_{2,1}+h_{5,1}+h_{8,1}+h_{11,1})d_1 + \ldots + (h_{2,11}+h_{5,11}+h_{8,11}+11,11})d_{11}$$

After determining $p_0$, $p_1$, $p_2$ the other parity check bits are obtained recursively:

$$p_3 = h_{0,0}d_0 + h_{0,1}d_1 + \ldots + h_{0,11}d_{11} + p_0$$

$$p_4 = h_{1,0}d_0 + h_{1,1}d_1 + \ldots + h_{1,11}d_{11} + p_1$$

$$p_5 = h_{2,0}d_0 + h_{2,1}d_1 + \ldots + h_{2,11}d_{11} + p_2$$

$$p_6 = h_{3,0}d_0 + h_{3,1}d_1 + \ldots + h_{3,11}d_{11} + p_0 + p_3$$

$$p_7 = h_{4,0}d_0 + h_{4,1}d_1 + \ldots + h_{4,11}d_{11} + p_1 + p_4$$

$$p_8 = h_{5,0}d_0 + h_{5,1}d_1 + \ldots + h_{5,11}d_{11} + p_2 + p_5$$

$$p_9 = h_{6,0}d_0 + h_{6,1}d_1 + \ldots + h_{6,11}d_{11} + p_6$$

$$p_{10} = h_{7,0}d_0 + h_{7,1}d_1 + \ldots + h_{7,11}d_{11} + p_7$$

$$p_{11} = h_{8,0}d_0 + h_{8,1}d_1 + \ldots + h_{8,11}d_{11} + p_8 \quad \text{[equation 14]}$$

The present invention provides new LPDC base parity matrices, and expanded matrices based on the new base parity matrices, and method for use thereof.

The locations of non-zero matrices for rate R in a first exemplary matrix are chosen, so that:

a) parity part ((1-R) *24 rightmost columns) of the matrix is designed to allow simple encoding algorithms;
b) weights of all columns in the data portion of base parity check matrix is uniform;
c) weights of all rows in the data portion of a base parity check matrix is uniform;
d) the parity part of the matrix allows simple encoding algorithms. For example, the encoding algorithm based on equation 1, or equation 14.

An example of R=¾ base parity check matrix design using criteria a) to d) is:

```
1 1 1 1 0 0 0 1 1 0 1 0 1 1 1 1 0 1 1 1 0 0 0 0
1 1 1 1 0 1 1 0 1 0 0 1 0 1 1 1 1 0 0 1 1 0 0 0
1 0 1 0 1 1 1 1 0 1 0 0 1 0 1 1 1 1 0 0 1 1 0 0
1 1 0 1 1 1 1 1 0 1 1 1 0 0 0 0 1 1 1 0 0 1 1 0
0 0 0 0 1 1 1 1 1 1 1 1 1 1 1 1 0 0 0 0 0 0 1 1
0 1 1 1 1 0 0 0 1 1 1 1 1 1 0 0 1 1 1 0 0 0 0 1
```

The rate $R=\frac{3}{4}$ matrix definition built based on such base parity check matrix covers expansion factors in the range L between 24 and $L_{max}=96$ in increments of 4. Right circular shifts of the corresponding L×L identity matrix $s'_{ij}$, are determined as follows:

$$s'_{ij} = \begin{cases} \text{floor}\left(\frac{L \times s_{ij}}{L_{max}}\right), & s_{ij} > 0, \\ s_{ij}, & \text{otherwise} \end{cases}$$

where $s_{ij}$ is specified in the matrix definition below:

c) maximum weight of the columns of the data portion is maximized, with a constraint of maximum total base parity check matrix weight; and d) row weight is uniform or close to uniform;

e) the parity part of the matrix uses simple encoding algorithms. For example, the encoding algorithm based on equation 1, or equation 14.

```
 6  38   3  93  -1  -1  -1  30  70  -1  86  -1  37  38   4  11  -1  46  48   0  -1  -1  -1  -1
62  94  19  84  -1  92  78  -1  15  -1  -1  92  -1  45  24  32  30  -1  -1   0   0  -1  -1  -1
71  -1  55  -1  12  66  45  79  -1  78  -1  -1  10  -1  22  55  70  82  -1  -1   0   0  -1  -1
38  61  -1  66   9  73  47  64  -1  39  61  43  -1  -1  -1  -1  95  32   0  -1  -1   0   0  -1
-1  -1  -1  -1  32  52  55  80  95  22   6  51  24  90  44  20  -1  -1  -1  -1  -1  -1   0   0
-1  63  31  88  20  -1  -1  -1   6  40  56  16  71  53  -1  -1  27  26  48  -1  -1  -1  -1   0
```

The locations of non-zero matrices for rate R in a second exemplary matrix are chosen, so that:

a) parity part ((1-R)*24 rightmost columns) of the matrix is designed to allow simple encoding algorithms;

b) minimum weight of the data portion of the matrix (R*24 leftmost columns) is 3;

For example, the base parity check matrix weight may be selected to be 88. The remaining weight is then distributed in the data part of the matrix in such a way that the matrix becomes as irregular as possible.

An example of $R=\frac{2}{3}$ base parity check matrix design using criteria a) to e) with the constraint of maximum base parity check matrix weight being 88, is:

```
1 1 1 1 1 0 0 0 0 0 0 1 0 1 1 1 1 1 0 0 0 0 0 0
1 1 1 1 0 0 0 1 1 1 1 0 1 0 0 0 0 1 1 0 0 0 0 0
1 1 1 1 1 1 0 0 0 1 0 0 0 1 0 0 0 1 1 0 0 0 0 0
1 1 1 1 1 0 0 0 0 1 1 0 1 1 0 0 0 0 0 1 1 0 0 0
1 1 1 1 0 1 1 0 1 0 0 1 0 0 0 0 1 0 0 0 1 1 0 0
1 1 1 1 1 0 1 0 0 0 0 0 1 1 1 0 0 0 0 0 0 1 1 0
1 1 1 1 1 1 0 1 0 0 0 1 0 0 0 1 0 0 0 0 0 0 1 1
1 1 1 1 1 0 0 1 1 1 0 0 0 0 0 1 1 0 0 0 0 0 0 1
```

Three matrices below expand the above base parity check matrix to achieve code lengths of 1944, 1296, and 648 bits using expansion factors L=81, 54, and 27, respectively.

Code Length=1944, Expansion Factor 81

```
61 75  4 63 56 -1 -1 -1 -1 -1 -1  8 -1  2 17 25  1  0 -1 -1 -1 -1 -1 -1
56 74 77 20 -1 -1 -1 64 24  4 67 -1  7 -1 -1 -1 -1  0  0 -1 -1 -1 -1 -1
28 21 68 10  7 14 65 -1 -1 -1 23 -1 -1 -1 75 -1 -1 -1  0  0 -1 -1 -1 -1
48 38 43 78 76 -1 -1 -1 -1  5 36 -1 15 72 -1 -1 -1 -1  0  0 -1 -1 -1 -1
40  2 53 25 -1 52 62 -1 20 -1 -1 44 -1 -1 -1  0 -1 -1 -1  0  0 -1 -1 -1
69 23 64 10 22 -1 21 -1 -1 -1 -1 -1 68 23 29 -1 -1 -1 -1 -1 -1  0  0 -1
12  0 68 20 55 61 -1 40 -1 -1 -1 52 -1 -1 -1 44 -1 -1 -1 -1 -1 -1  0  0
58  8 34 64 78 -1 -1 11 78 24 -1 -1 -1 -1 58  1 -1 -1 -1 -1 -1 -1 -1  0
```

Code Length=1296, Expansion Factor 54

```
49 13 11 30 27 -1 -1 -1 -1 -1 -1 34 -1 46  0 45  1  0 -1 -1 -1 -1 -1 -1
38 32 35 53 -1 -1 -1 14 40 12  7 -1 42 -1 -1 -1 -1  0  0 -1 -1 -1 -1 -1
13 52 19 51 42 23 49 -1 -1 -1 20 -1 -1 -1  3 -1 -1 -1  0  0 -1 -1 -1 -1
43 22 23 48  7 -1 -1 -1 38 28 -1 46 17 -1 -1 -1 -1 -1  0  0 -1 -1 -1 -1
41 25 44 17 -1 11 46 -1 27 -1 -1 12 -1 -1 -1 -1  0 -1 -1 -1  0  0 -1 -1
12 27 32  9 13 -1 41 -1 -1 -1 -1 49 31 23 -1 -1 -1 -1 -1 -1 -1  0  0 -1
 8 34 23 35 23 52 -1 36 -1 -1 -1 43 -1 -1 -1  5 -1 -1 -1 -1 -1 -1  0  0
17 19 48 16 11 -1 -1 38 43 11 -1 -1 -1 -1  8  1 -1 -1 -1 -1 -1 -1 -1  0
```

Code Length=648, Expansion Factor 27

```
 3 11 13 25  4 -1 -1 -1 -1 -1 -1 22 -1 11 15 22  1  0 -1 -1 -1 -1 -1 -1
10  2 19 12 -1 -1 -1 15  5  9 24 -1 15 -1 -1 -1 -1  0  0 -1 -1 -1 -1 -1
 4 26 24 11  2 19 17 -1 -1 -1  3 -1 -1 -1  4 -1 -1 -1  0  0 -1 -1 -1 -1
24 21 15  5  8 -1 -1 -1 19 15 -1 17  3 -1 -1 -1 -1 -1  0  0 -1 -1 -1 -1
15 18  7 25 -1  7  6 -1  8 -1 -1  4 -1 -1 -1 -1  0 -1 -1 -1  0  0 -1 -1
 1 24 23 12 23 -1  1 -1 -1 -1 -1 -1  0  0 12 -1 -1 -1 -1 -1 -1  0  0 -1
13  4 12 17 22 23 -1  4 -1 -1 -1  6 -1 -1 -1  9 -1 -1 -1 -1 -1 -1  0  0
14 25 26  3  5 -1 -1  8  2  7 -1 -1 -1 -1  7  1 -1 -1 -1 -1 -1 -1 -1  0
```

What is claimed is:

1. A method for constructing a low-density parity-check (LDPC) code having a structured parity check matrix, the method comprising the steps of:
   constructing, in a computer processor, a base parity check matrix $H=[H_d|H_p]$ having a plurality of elements, $H_d$ being a data portion of the base parity check matrix, $H_p$ being the parity portion of the base parity check matrix; and
   expanding the base parity check matrix into an expanded parity check matrix by replacing each non-zero element of the plurality of elements by a shifted identity matrix; and each zero element of the plurality of elements by a zero matrix;
   wherein the base parity check matrix has a coding rate selected from the group consisting of R=½, ⅔, ¾, ⅚, and ⅞; and accordingly is of the size selected from the group consisting of 12×24, 8×24, 6×24, 4×24, and 3×24.

2. The method of claim 1 wherein the parity portion allows a recursive encoding algorithm.

3. The method of claim 1 wherein an inverse of the parity portion of the expanded parity check matrix is sparse, allowing simple encoding per equation $$p = H_{p\_exp}^{-1} H_{d\_exp} d$$

and wherein
- d is a vector of uncoded bits,
- p is a vector of parity bits,
- $H_{p\_exp}^{-1}$ is the inverse of the parity portion $H_p$ of the expanded parity check matrix, and
- $H_{d\_exp}$ is the data portion $H_d$ the expanded parity check matrix.

4. The method of claim 1, wherein the data portion of the base parity check matrix has a minimum column weight of 3.

5. The method of claim 1, wherein the base parity check matrix has a coding rate of R=⅔, and is of the size 8×24.

6. The method of claim 5, wherein the data portion of the base parity check matrix has a minimum column weight of 3.

7. The method of claim 6, wherein the data portion of the base parity check matrix has a maximum column weight of 8.

8. The method of claim 7, wherein the total weight of the base parity check matrix is equal or less then 88.

9. The method of claim 8, wherein the base parity check matrix is:

```
1 1 1 1 1 0 0 0 0 0 0 1 0 1 1 1 1 0 0 0 0 0 0 0
1 1 1 1 0 0 0 1 1 1 1 0 1 0 0 0 0 1 1 0 0 0 0 0
1 1 1 1 1 1 1 0 0 0 1 0 0 0 1 0 0 0 1 1 0 0 0 0
1 1 1 1 1 0 0 0 0 1 1 0 1 1 0 0 0 0 0 1 1 0 0 0
1 1 1 1 0 1 1 0 1 0 0 1 0 0 0 0 1 0 0 0 1 1 0 0
1 1 1 1 1 0 1 0 0 0 0 0 1 1 1 0 0 0 0 0 0 1 1 0
1 1 1 1 1 1 0 1 0 0 0 1 0 0 0 1 0 0 0 0 0 0 1 1
1 1 1 1 1 0 0 1 1 1 0 0 0 0 0 0 1 1 0 0 0 0 0 1
```

10. The method of claim 9 wherein the base parity check matrix is expanded by an expansion factor L of 81, thereby supporting a code length of up to 1944, and is represented by the expanded parity check matrix:

```
61 75  4 63 56 -1 -1 -1 -1 -1 -1  8 -1  2 17 25  1  0 -1 -1 -1 -1 -1 -1
56 74 77 20 -1 -1 -1 64 24  4 67 -1  7 -1 -1 -1 -1  0  0 -1 -1 -1 -1 -1
28 21 68 10  7 14 65 -1 -1 -1 23 -1 -1 -1 75 -1 -1 -1  0  0 -1 -1 -1 -1
48 38 43 78 76 -1 -1 -1 -1  5 36 -1 15 72 -1 -1 -1 -1 -1  0  0 -1 -1 -1
40  2 53 25 -1 52 62 -1 20 -1 -1 44 -1 -1 -1 -1  0 -1 -1 -1  0  0 -1 -1
69 23 64 10 22 -1 21 -1 -1 -1 -1 68 23 29 -1 -1 -1 -1 -1 -1 -1  0  0 -1
12  0 68 20 55 61 -1 40 -1 -1 -1 52 -1 -1 -1 44 -1 -1 -1 -1 -1 -1  0  0
58  8 34 64 78 -1 -1 11 78 24 -1 -1 -1 -1 58  1 -1 -1 -1 -1 -1 -1 -1  0
``` wherein −1 represents L×L all-zero square matrix, and other integers represent L×L identity matrix, circularly right shifted a number of times corresponding to the integers.

11. The method of claim 10 wherein the base parity check matrix is expanded by an expansion factor L of 27, thereby supporting a code length of up to 648, and is represented by the expanded parity check matrix:

```
 3 11 13 25  4 -1 -1 -1 -1 -1 -1 22 -1 11 15 22  1  0 -1 -1 -1 -1 -1 -1
10  2 19 12 -1 -1 -1 15  5  9 24 -1 15 -1 -1 -1 -1  0  0 -1 -1 -1 -1 -1
 4 26 24 11  2 19 17 -1 -1 -1  3 -1 -1 -1  4 -1 -1 -1  0  0 -1 -1 -1 -1
24 21 15  5  8 -1 -1 -1 -1 19 15 -1 17  3 -1 -1 -1 -1 -1  0  0 -1 -1 -1
15 18  7 25 -1  7  6 -1  8 -1 -1  4 -1 -1 -1 -1  0 -1 -1 -1  0  0 -1 -1
 1 24 23 12 23 -1  1 -1 -1 -1 -1 -1  0  0 12 -1 -1 -1 -1 -1 -1  0  0 -1
13  4 12 17 22 23 -1  4 -1 -1 -1  6 -1 -1 -1  9 -1 -1 -1 -1 -1 -1  0  0
14 25 26  3  5 -1 -1  8  2  7 -1 -1 -1 -1 -1  7 -1 -1 -1 -1 -1 -1 -1  0
``` wherein −1 represents L×L all-zero square matrix, and other integers represent L×L identity matrix, circularly right shifted a number of times corresponding to the integers.

12. The method of claim 9 wherein the base parity check matrix is expanded by an expansion factor L of 54, thereby supporting a code length of up to 1296, and is represented by the expanded parity check matrix:

$$s'_{ij} = \begin{cases} \text{floor}\left(\dfrac{L \times s_{ij}}{L_{\max}}\right), & s_{ij} > 0 \\ s_{ij}, & \text{otherwise} \end{cases}.$$

```
49 13 11 30 27 -1 -1 -1 -1 -1 -1 34 -1 46  0 45  1  0 -1 -1 -1 -1 -1 -1
38 32 35 53 -1 -1 -1 14 40 12  7 -1 42 -1 -1 -1 -1  0  0 -1 -1 -1 -1 -1
13 52 19 51 42 23 49 -1 -1 -1 20 -1 -1 -1  3 -1 -1 -1  0  0 -1 -1 -1 -1
43 22 23 48  7 -1 -1 -1 -1 38 28 -1 46 17 -1 -1 -1 -1  0  0 -1 -1 -1
41 25 44 17 -1 11 46 -1 27 -1 -1 12 -1 -1 -1 -1  0 -1 -1 -1  0  0 -1 -1
12 27 32  9 13 -1 41 -1 -1 -1 -1 -1 49 31 23 -1 -1 -1 -1 -1  0  0 -1
 8 34 23 35 23 52 -1 36 -1 -1 -1 43 -1 -1 -1  5 -1 -1 -1 -1 -1 -1  0  0
17 19 48 16 11 -1 -1 38 43 11 -1 -1 -1 -1 -1  8  1 -1 -1 -1 -1 -1 -1  0
``` wherein −1 represents L×L all-zero square matrix, and other integers represent L×L identity matrix, circularly right shifted a number of times corresponding to the integers.

13. The method of claim 1 wherein weights of all columns in the data portion of the base parity check matrix are uniform.

14. The method of claim 13 wherein the weights of all rows in the data portion of a base parity check matrix is uniform.

15. The method of claim 14 wherein the base parity check matrix has a coding rate of R=¾, and is:

```
1 1 1 1 0 0 0 1 1 0 1 0 1 1 1 1 0 1 1 1 0 0 0 0
1 1 1 1 0 1 1 0 1 0 0 1 0 1 1 1 1 0 0 1 1 0 0 0
1 0 1 0 1 1 1 1 0 1 0 0 1 0 1 1 1 1 0 0 1 1 0 0
1 1 0 1 1 1 1 1 0 1 1 1 0 0 0 0 1 1 1 0 0 1 1 0
0 0 0 0 1 1 1 1 1 1 1 1 1 1 1 1 0 0 0 0 0 0 1 1
0 1 1 1 1 0 0 0 1 1 1 1 1 1 1 0 0 1 1 1 0 0 0 1
```

16. The method of claim 15 wherein the base parity check matrix is expanded by expansion factors L between 24 and $L_{max}=96$, and is represented by the expanded parity check matrix:

```
 6 38  3 93 -1 -1 -1 30 70 -1 86 -1 37 38  4 11 -1 46 48  0 -1 -1 -1 -1
62 94 19 84 -1 92 78 -1 15 -1 -1 92 -1 45 24 32 30 -1 -1  0  0 -1 -1 -1
71 -1 55 -1 12 66 45 79 -1 78 -1 -1 10 -1 22 55 70 82 -1 -1  0  0 -1 -1
38 61 -1 66  9 73 47 64 -1 39 61 43 -1 -1 -1 -1 95 32  0 -1 -1  0  0 -1
-1 -1 -1 -1 32 52 55 80 95 22  6 51 24 90 44 20 -1 -1 -1 -1 -1 -1  0  0
-1 63 31 88 20 -1 -1 -1  6 40 56 16 71 53 -1 -1 27 26 48 -1 -1 -1 -1  0
``` wherein −1 represents L×L all-zero square matrix, the integer $s_{ij}$ represents circular shifted L×L identity matrix, the amount of the shift $s_{ij}'$ is determined as follows:

17. The LDPC code constructed using the method of claim 16.

18. A device using the LDPC code of claim 16.

19. The LDPC code constructed using the method of claim 15.

20. A device using the LDPC code of claim 15.

21. A storage medium readable by a computer encoding a computer program for execution by the computer to carry out a method for constructing a low-density parity-check (LDPC) code having a structured parity check matrix, the method comprising the steps of:

constructing, in a computer processor, a base parity check matrix $H=[H_d|H_p]$ having a plurality of elements, $H_d$ being a data portion of the base parity check matrix, $H_p$ being the parity portion of the base parity check matrix; and expanding the base parity check matrix into an expanded parity check matrix by replacing each non-zero element of the plurality of elements by a shifted identity matrix, and each zero element of the plurality of elements by a zero matrix;

wherein the base parity check matrix has a coding rate selected from the group consisting of R=½, ⅔, ¾, ⅚, and ⅞; and accordingly is of the size selected from the group consisting of 12×24, 8×24, 6×24, 4×24, and 3×24.

22. The storage medium of claim 21, wherein the data portion of the base parity check matrix has a minimum weight of 3, the base parity check matrix has a constraint of maximum base parity check matrix weight of 88, and the base parity check matrix is:

```
1 1 1 1 1 0 0 0 0 0 0 1 0 1 1 1 1 0 0 0 0 0 0 0
1 1 1 1 0 0 0 1 1 1 1 0 1 0 0 0 0 1 1 0 0 0 0 0
1 1 1 1 1 1 1 0 0 0 1 0 0 0 1 0 0 0 1 1 0 0 0 0
1 1 1 1 1 0 0 0 0 1 1 0 1 1 0 0 0 0 0 1 1 0 0 0
1 1 1 1 0 1 1 0 1 0 0 1 0 0 0 0 1 0 0 0 1 1 0 0
1 1 1 1 1 0 1 0 0 0 0 0 1 1 1 0 0 0 0 0 0 1 1 0
1 1 1 1 1 1 0 1 0 0 0 1 0 0 0 1 0 0 0 0 0 0 1 1
1 1 1 1 1 0 0 1 1 1 0 0 0 0 0 0 1 1 0 0 0 0 0 1
```

23. The storage medium of claim 21 wherein the base parity check matrix is expanded by an expansion factor L of 27, thereby supporting a code length of up to 648, and is represented by following matrix:

```
 3 11 13 25  4 -1 -1 -1 -1 -1 -1 22 -1 11 15 22  1  0 -1 -1 -1 -1 -1 -1
10  2 19 12 -1 -1 -1 15  5  9 24 -1 15 -1 -1 -1 -1  0  0 -1 -1 -1 -1 -1
 4 26 24 11  2 19 17 -1 -1 -1  3 -1 -1 -1  4 -1 -1 -1  0  0 -1 -1 -1 -1
24 21 15  5  8 -1 -1 -1 -1 19 15 -1 17  3 -1 -1 -1 -1 -1  0  0 -1 -1 -1
15 18  7 25 -1  7  6 -1  8 -1 -1  4 -1 -1 -1 -1  0 -1 -1 -1  0  0 -1 -1
 1 24 23 12 23 -1  1 -1 -1 -1 -1 -1  0  0 12 -1 -1 -1 -1 -1 -1  0  0 -1
13  4 12 17 22 23 -1  4 -1 -1 -1  6 -1 -1 -1  9 -1 -1 -1 -1 -1 -1  0  0
14 25 26  3  5 -1 -1  8  2  7 -1 -1 -1 -1  7 -1 -1 -1 -1 -1 -1 -1 -1  0
``` wherein −1 represents L×L all-zero square matrix, and other integers represent L×L identity matrix, circularly right shifted a number of times corresponding to the integers.

24. The storage medium of claim 21 wherein the base parity check matrix has a coding rate of R=¾, and is:

```
1 1 1 1 0 0 0 1 1 0 1 0 1 1 1 1 0 1 1 1 0 0 0 0
1 1 1 1 0 1 1 0 1 0 0 1 0 1 1 1 1 0 0 1 1 0 0 0
1 0 1 0 1 1 1 1 0 1 0 0 1 0 1 1 1 1 0 0 1 1 0 0
1 1 0 1 1 1 1 1 0 1 1 1 0 0 0 0 1 1 1 0 0 1 1 0
0 0 0 0 1 1 1 1 1 1 1 1 1 1 1 1 0 0 0 0 0 0 1 1
0 1 1 1 1 0 0 0 1 1 1 1 1 1 0 0 1 1 1 0 0 0 0 1
```

25. The storage medium of claim 24 wherein the base parity check matrix is expanded by expansion factors L between 24 and $L_{max}$=96, and is represented by the expanded parity check matrix:

```
 6  38   3  93  -1  -1  -1  30  70  -1  86  -1  37  38   4  11  -1  46  48   0  -1  -1  -1  -1
62  94  19  84  -1  92  78  -1  15  -1  -1  92  -1  45  24  32  30  -1  -1   0   0  -1  -1  -1
71  -1  55  -1  12  66  45  79  -1  78  -1  -1  10  -1  22  55  70  82  -1  -1   0   0  -1  -1
38  61  -1  66   9  73  47  64  -1  39  61  43  -1  -1  -1  -1  95  32   0  -1  -1   0   0  -1
-1  -1  -1  -1  32  52  55  80  95  22   6  51  24  90  44  20  -1  -1  -1  -1  -1  -1   0   0
-1  63  31  88  20  -1  -1  -1   6  40  56  16  71  53  -1  -1  27  26  48  -1  -1  -1  -1   0
``` wherein −1 represents L×L all-zero square matrix, the integer $s_{ij}$ represents circular shifted L×L identity matrix, the amount of the shift $s_{ij}'$ is determined as follows:

$$s_{ij}' = \begin{cases} \text{floor}\left(\dfrac{L \times s_{ij}}{L_{max}}\right), & s_{ij} > 0 \\ s_{ij}, & \text{otherwise} \end{cases}.$$

26. A device using a low density parity check (LDPC) code expanded from an LDPC base parity check matrix comprising a data part having a minimum weight of 3, the base parity check matrix having a coding rate of R=⅔, a constraint of maximum base parity check matrix weight of 88, the LDPC base parity check matrix being:

```
1 1 1 1 0 0 0 0 0 0 1 0 1 1 1 1 0 0 0 0 0 0
1 1 1 0 0 0 1 1 1 1 0 1 0 0 0 0 1 1 0 0 0 0
1 1 1 1 1 1 1 0 0 0 1 0 0 0 1 0 0 0 1 1 0 0 0 0
1 1 1 1 1 0 0 0 0 1 1 0 1 1 0 0 0 0 0 1 1 0 0 0
1 1 1 1 0 1 1 0 1 0 0 1 0 0 0 0 1 0 0 0 1 1 0 0
1 1 1 1 1 0 1 0 0 0 0 0 1 1 1 0 0 0 0 0 0 1 1 0
1 1 1 1 1 1 0 1 0 0 0 1 0 0 0 1 0 0 0 0 0 0 1 1
1 1 1 1 1 0 0 1 1 1 0 0 0 0 0 1 1 0 0 0 0 0 0 1
``` by an expansion factor L of 27, thereby supporting a code length of 648, and is represented by following matrix:

```
 3  11  13  25   4  -1  -1  -1  -1  -1  -1  22  -1  11  15  22   1   0  -1  -1  -1  -1  -1  -1
10   2  19  12  -1  -1  -1  15   5   9  24  -1  15  -1  -1  -1  -1   0   0  -1  -1  -1  -1  -1
 4  26  24  11   2  19  17  -1  -1  -1   3  -1  -1  -1   4  -1  -1  -1   0   0  -1  -1  -1  -1
24  21  15   5   8  -1  -1  -1  -1  19  15  -1  17   3  -1  -1  -1  -1  -1   0   0  -1  -1  -1
15  18   7  25  -1   7   6  -1   8  -1  -1   4  -1  -1  -1  -1   0  -1  -1  -1   0   0  -1  -1
 1  24  23  12  23  -1   1  -1  -1  -1  -1  -1   0   0  12  -1  -1  -1  -1  -1  -1   0   0  -1
13   4  12  17  22  23  -1   4  -1  -1  -1   6  -1  -1  -1   9  -1  -1  -1  -1  -1  -1   0   0
14  25  26   3   5  -1  -1   8   2   7  -1  -1  -1  -1   7  -1  -1  -1  -1  -1  -1  -1  -1   0
``` wherein 1 represents L×L all-zero square matrix, and other integers represent L×L identity matrix, circularly right shifted a number of times corresponding to the integers.

27. A method for encoding data, the method comprising the steps of:

constructing, in a computer processor, a low density parity check (LDPC) base parity check matrix comprising a data part having a minimum weight of 3, the base parity check matrix having a coding rate of R=⅔, a constraint of maximum base parity check matrix weight of 88, the LDPC base parity check matrix being:

```
1 1 1 1 0 0 0 1 1 0 1 0 1 1 1 1 0 1 1 1 0 0 0 0
1 1 1 1 0 1 1 0 1 0 0 1 0 1 1 1 1 0 0 1 1 0 0 0
1 0 1 0 1 1 1 1 0 1 0 0 1 0 1 1 1 1 0 0 1 1 0 0
1 1 0 1 1 1 1 1 0 1 1 1 0 0 0 0 1 1 1 0 0 1 1 0
0 0 0 0 1 1 1 1 1 1 1 1 1 1 1 1 0 0 0 0 0 0 1 1
0 1 1 1 1 0 0 0 1 1 1 1 1 1 0 0 1 1 1 0 0 0 0 1
``` expanding from the LDPC base parity check matrix, by an expansion factor L of 27, thereby supporting a code length of up to 648, resulting in an expanded LDPC code represented by following matrix:

```
 3 11 13 25  4 -1 -1 -1 -1 -1 -1 22 -1 11 15 22  1  0 -1 -1 -1 -1 -1 -1
10  2 19 12 -1 -1 -1 15  5  9 24 -1 15 -1 -1 -1 -1  0  0 -1 -1 -1 -1 -1
 4 26 24 11  2 19 17 -1 -1 -1  3 -1 -1 -1  4 -1 -1 -1  0  0 -1 -1 -1 -1
24 21 15  5  8 -1 -1 -1 -1 19 15 -1 17  3 -1 -1 -1 -1 -1  0  0 -1 -1 -1
15 18  7 25 -1  7  6 -1  8 -1 -1  4 -1 -1 -1 -1  0 -1 -1 -1  0  0 -1 -1
 1 24 23 12 23 -1  1 -1 -1 -1 -1 -1  0  0 12 -1 -1 -1 -1 -1 -1  0  0 -1
13  4 12 17 22 23 -1  4 -1 -1 -1  6 -1 -1 -1  9 -1 -1 -1 -1 -1 -1  0  0
14 25 26  3  5 -1 -1  8  2  7 -1 -1 -1 -1 -1  7  1 -1 -1 -1 -1 -1 -1  0
``` wherein 1 represents L×L all-zero square matrix, and other integers represent L×L identity matrix, circularly right shifted a number of times corresponding to the integers.

* * * * *

UNITED STATES PATENT AND TRADEMARK OFFICE
CERTIFICATE OF CORRECTION

PATENT NO.       : 7,752,521 B2                                                          Page 1 of 1
APPLICATION NO.  : 11/393622
DATED            : July 6, 2010
INVENTOR(S)      : Michael Livshitz It is certified that error appears in the above-identified patent and that said Letters Patent is hereby corrected as shown below:

In column 24, lines 20-64, in Claim 27, please delete: "LDPC base parity check matrix being:

```
1 1 1 1 0 0 0 1 1 0 1 0 1 1 1 1 0 1 1 1 0 0 0 0
1 1 1 1 0 1 1 0 1 0 0 1 0 1 1 1 1 0 0 1 1 0 0 0
1 0 1 0 1 1 1 1 0 1 0 0 1 0 1 1 1 1 0 0 1 1 0 0
1 1 0 1 1 1 1 1 0 1 1 1 0 0 0 0 1 1 1 0 0 1 1 0
0 0 0 0 1 1 1 1 1 1 1 1 1 1 1 1 0 0 0 0 0 0 1 1
0 1 1 1 1 0 0 0 1 1 1 1 1 1 0 0 1 1 1 0 0 0 0 1
``` expanding from the LDPC base parity check matrix" and insert therefor: --LDPC base parity check matrix being:

```
1 1 1 1 1 0 0 0 0 0 1 0 1 1 1 1 1 0 0 0 0 0 0
1 1 1 1 0 0 0 1 1 1 1 0 1 0 0 0 0 1 1 0 0 0 0 0
1 1 1 1 1 1 1 0 0 0 1 0 0 0 1 0 0 0 1 1 0 0 0 0
1 1 1 1 1 0 0 0 0 1 1 0 1 1 0 0 0 0 0 1 1 0 0 0
1 1 1 1 0 1 1 0 1 0 0 1 0 0 0 0 1 0 0 0 1 1 0 0
1 1 1 1 1 0 1 0 0 0 0 0 0 1 1 1 0 0 0 0 0 1 1 0
1 1 1 1 1 1 0 1 0 0 0 1 0 0 0 1 0 0 0 0 0 0 1 1
1 1 1 1 1 0 0 1 1 1 0 0 0 0 0 0 1 1 0 0 0 0 0 1
``` expanding from the LDPC base parity check matrix--.

In column 25, line 17, in Claim 27, please delete "wherein 1 represents" and insert therefor: --wherein -1 represents--.

Signed and Sealed this

Sixteenth Day of November, 2010

David J. Kappos
*Director of the United States Patent and Trademark Office*